United States Patent
Oh et al.

(10) Patent No.: US 10,418,424 B2
(45) Date of Patent: Sep. 17, 2019

(54) ORGANIC LIGHT EMITTING DISPLAY HAVING TOUCH SENSOR WITH AMORPHOUS TRANSPARENT CONDUCTIVE LAYER AND METHOD OF FABRICATING THE SAME

(71) Applicant: LG Display Co., Ltd., Seoul (KR)

(72) Inventors: Jae-Young Oh, Goyang-si (KR); Min-Joo Kim, Seoul (KR); Jae-Won Lee, Goyang-si (KR); Eun-Hye Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 56 days.

(21) Appl. No.: 15/606,771

(22) Filed: May 26, 2017

(65) Prior Publication Data

US 2018/0061898 A1 Mar. 1, 2018

(30) Foreign Application Priority Data

Aug. 31, 2016 (KR) .......................... 10-2016-0112191

(51) Int. Cl.
*H01L 29/08* (2006.01)
*H01L 27/32* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC . H01L 27/323; H01L 27/3279; H01L 27/322; G06F 3/0412
(Continued)

(56) References Cited

U.S. PATENT DOCUMENTS

2012/0319572 A1 12/2012 Lee et al.
2014/0042398 A1* 2/2014 Choi .................. H01L 27/3244
257/40
(Continued)

FOREIGN PATENT DOCUMENTS

EP 2592533 5/2013
EP 3016167 5/2016
(Continued)

OTHER PUBLICATIONS

G.A. Potoczny, Flexibility and electrical stability of polyester-based device electrodes under monotonic and cyclic buckling conditions, Thin Solid Films 528 (2013) 205-212.*
(Continued)

*Primary Examiner* — Caleb E Henry
(74) *Attorney, Agent, or Firm* — Fenwick & West LLP

(57) ABSTRACT

Disclosed are an organic light emitting display having touch sensors, which may achieve process simplification and cost reduction, and a method of fabricating the same. The organic light emitting display includes a plurality of touch electrodes disposed on an encapsulation unit disposed so as to cover light emitting elements, the touch electrodes are formed through a low-temperature deposition process and may thus have amorphous characteristics so as to prevent damage to an organic light emitting layer during formation of the touch electrodes, and the touch electrodes are disposed on the encapsulation unit without a separate attachment process and may thus simplify the overall process and reduce manufacturing costs.

24 Claims, 9 Drawing Sheets

(51) Int. Cl.
   *H01L 51/52*   (2006.01)
   *G06F 3/041*   (2006.01)
   *G06F 3/044*   (2006.01)

(52) U.S. Cl.
   CPC ........ *H01L 27/322* (2013.01); *H01L 27/3246* (2013.01); *H01L 27/3297* (2013.01); *H01L 51/5253* (2013.01); *G06F 2203/04103* (2013.01); *G06F 2203/04111* (2013.01); *G06F 2203/04112* (2013.01)

(58) Field of Classification Search
   USPC .......................................................... 257/40
   See application file for complete search history.

(56) References Cited

U.S. PATENT DOCUMENTS

| | | |
|---|---|---|
| 2014/0145979 A1 | 5/2014 | Lee |
| 2015/0185915 A1* | 7/2015 | Lim ................. G06F 3/044 345/174 |
| 2015/0262528 A1* | 9/2015 | Takahara ........... G09G 3/3225 345/212 |
| 2016/0126498 A1 | 5/2016 | Kim |
| 2017/0177112 A1 | 6/2017 | Chen et al. |
| 2017/0220182 A1* | 8/2017 | Schwartz ............. G06F 3/0416 |

FOREIGN PATENT DOCUMENTS

| | | |
|---|---|---|
| KR | 20120062341 | 6/2012 |
| KR | 20160051207 | 5/2016 |
| KR | 20160093187 | 8/2016 |
| TW | I465986 B | 12/2014 |
| TW | I466001 A | 12/2014 |
| WO | WO 2015/160516 | 10/2015 |

OTHER PUBLICATIONS

Extended European Search Report for European Patent Application No. EP 17184532.4, dated Jan. 31, 2018, 11 Pages.

Taiwanese Patent Office, Office Action, TW Patent Application No. 106122587, dated Jun. 6, 2018, 18 pages.

Office Action for Korean Patent Application No. KR 10-2016-0112191, dated Nov. 17, 2017, 7 Pages (with Concise explanation of relevance).

* cited by examiner

ORGANIC LIGHT EMITTING DISPLAY HAVING TOUCH SENSOR WITH AMORPHOUS TRANSPARENT CONDUCTIVE LAYER AND METHOD OF FABRICATING THE SAME

CROSS-REFERENCE TO RELATED APPLICATIONS

This patent application claims the benefit of Korean Patent Application No. 10-2016-0112191, filed on Aug. 31, 2016, which is incorporated by reference in its entirety.

BACKGROUND

Field of the Invention

The present disclosure relates to an organic light emitting display having touch sensors and a method of fabricating the same, and more particularly, to an organic light emitting display having a touch sensor which may achieve process simplification and cost reduction, and a method of fabricating the same.

Discussion of the Related Art

A touchscreen is an input device through which a user may input a command by selecting instructions displayed on a screen of a display, using a hand or an object. That is, the touchscreen converts a contact position directly contacting a human hand or an object into an electrical signal and receives instructions selected at the contact position as an input signal. Such a touchscreen may substitute for a separate input device connected to a display device and operated, such as a keyboard or a mouse, and thus applications of touchscreens have gradually increased.

In general, a touchscreen is attached to the front surface of a display panel, such as a liquid crystal display panel or an organic electroluminescent display panel, through an adhesive. In this case, since the touchscreen is separately manufactured and then attached to the front surface of the display panel, an attachment process is additionally carried out and thus the overall process becomes complicated and manufacturing costs are raised.

SUMMARY

Accordingly, the present disclosure is directed to an organic light emitting display having touch sensors and a method of fabricating the same that substantially obviate one or more problems due to limitations and disadvantages of the related art.

An object of the present disclosure is to provide an organic light emitting display having touch sensors which may achieve process simplification and cost reduction, and a method of fabricating the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The object is solved by the features of the independent claims. Various embodiments are given in the dependent claims.

To achieve these objects and other advantages and in accordance with the purpose of the invention, as embodied and broadly described herein, an organic light emitting display includes light emitting elements disposed on a substrate, an encapsulation unit disposed on the light emitting elements and including a plurality of inorganic encapsulation layers and at least one organic encapsulation layer disposed between the inorganic encapsulation layers, and a plurality of touch electrodes disposed on the encapsulation unit and formed of an amorphous transparent conductive layer.

Routing lines are provided for connecting the plurality of touch electrodes to a touch pad.

A touch buffer film is disposed between the encapsulation unit and the touch electrodes.

The touch buffer film is disposed also on side edge of the encapsulation unit between the encapsultion layer and the routing layer extending downwardly to the touch pad area.

The routing lines comprise a first routing layer and a second routing layer.

The first routing layer of the routing lines is made of an inorganic conductive material.

The second routing layer of the routing lines is made of transparent conductive layer.

The second routing layer of the routing lines is made of the same material as at least one of the touch electrodes.

A portion of the first routing layer of the routing lines overlaps an upper side of the touch buffer layer.

A portion of the first routing layer is provided on same layer as at least one of the touch electrodes.

The first routing layer of the routing lines is provided on an upper side of the touch buffer layer in the non display area.

The first routing layer of the routing lines is thicker than second routing layer of the routing lines.

The first routing layer is thicker than at least one of the touch electrodes.

A touch insulating film is provided on a portion of or at least partly overlapping the first routing layer of the routing lines. So the touch insulating film is directly provided on touch buffer layer, thereby separating the first routing layer from the first touch electrode.

The touch insulating film is electrically separating the first routing layer of the routing lines from at least one of the touch electrodes. The touch insulating film is insulating or separating upper portion of the first routing layer from the first touch electrode.

One of the touch electrodes is electrically connected to the first routing layer of the routing line via the second routing layer of the routing line by a routing contact hole. In particular the first touch electrode is electrically connected via the routing contact hole with the second routing layer and thus also with the first routing layer. The routing contact hole is filled with material of the second routing layer and/or the material of the second touch electrode.

An insulation layer is provided, wherein at least a portion of the routing lines is disposed on the insulation layer.

The routing line comprising an upper portion, a side portion and a lower portion. Here the upper portion is provided on top of the touch buffer film. The side portion of the routing line is covering the inclined side edge or slope is covered. So the side portion also covers the side portion of the encapsulation unit. The lower portion is provided on the insulating film in the flat portion of the insulating film. So it is directly contacting or covering the insulating film. Thereby a very reliable contact between the routing line and the insulating film is achieved preventing introduction of humidity and oxygen. The lower portion is partly forming the touch pad.

The lower electrode of the OLED is provided on the insulating layer and on the same layer as the lower portion of the routing line. Thereby a very thin and easy structure of the incell touch device is achieved.

The second routing layer of the routing lines is fully covering the first routing layer of the routing line in a portion of the touch pad. As the touch pad is made of the first and second routing layers, the first routing layer in the touch pad area is full blocked and covered by the second routing layer, thereby the underlying first routing layer is further protected.

The second routing layer of the routing line is contacting the insulating layer at the outermost portion. Thus, the touch pad is shielded or covered by the second routing layer to prevent the introduction of humidity or oxygen.

The upper portion of the routing lines is partly overlapping the encapsulation unit. Thus, the encapsulation is further improved.

The upper portion of the routing lines is provided on a higher level than the encapsulation unit. Thereby, a layer made of inorganic material is further covering the side and a part of the encapsulation unit to increase the encapsultion characteristic.

At least a part of the first routing layer of the routing lines is provided on a higher level than the encapsulation unit.

At least one of the first and second bridges is located corresponding to a bank for defining pixel areas. Thus, the first and/or second bridge is located on top or over a bank. Thereby the visibility of the first and/or second bridges is reduced, as the bank already defines an area which is not emitting light, so by arranging the first and/or second bridges in such an area there is no additional space needed or consumed in the pixel areas, where light is emitted.

The organic light emitting display further comprises a touch buffer film disposed between the encapsulation unit and the touch electrodes.

The touch buffer film is formed of a photoacryl-based, epoxy-based, parylene-C-based, parylene-N-based, parylene-F-based or siloxane-based organic film.

The organic light emitting display further comprises a touch insulating film disposed so as to cover the touch electrodes.

The organic light emitting display further comprises a plurality of second touch electrodes disposed so as to be spaced apart from the touch electrodes.

The organic light emitting display further comprises first bridges configured to connect the touch electrodes.

Organic light emitting display further comprises second bridges configured to connect the second touch electrodes.

At least one of the touch electrodes, the second touch electrodes, the first bridges and the second bridges is formed of an amorphous transparent conductive layer.

At least one of the touch insulating film and the at least one organic encapsulation layer is formed of a photoacryl-based, epoxy-based, parylene-C-based, parylene-N-based, parylene-F-based or siloxane-based organic film.

At least one of the touch insulating film and the inorganic encapsulation layers is an inorganic film having a multilayer structure, wherein the inorganic film is formed of SiNx, SiON or SiO2.

At least one of the first and second touch electrodes comprises: a mesh metal layer have a mesh shaped pattern; and a transparent conductive layer located on or under the mesh metal layer.

At least one of the first and second bridges comprises a slit.

The slit of the at least one of the first and second bridges overlaps with the other one of the first and second bridges.

The organic light emitting display further comprises a color filter between the encapsulation unit and the touch electrodes.

Each of the touch electrodes has electrically independent self-capacitance.

The organic light emitting display further comprises routing lines connected to the touch electrodes, wherein the routing line covers a side surface of the encapsulation unit or the touch buffer film.

The organic light emitting display further comprises an insulating layer between the substrate and the encapsulation unit; and touch pads electrically connected to the touch electrodes through the routing lies and in contact with the insulating layer.

The object is also solved by a method of fabricating an organic light emitting display comprising: forming light emitting elements disposed on a substrate; forming an encapsulation unit disposed on the light emitting elements and including a plurality of inorganic encapsulation layers and at least one organic encapsulation layer disposed between the inorganic encapsulation layers; and forming a plurality of touch electrodes formed of an amorphous transparent conductive layer on the encapsulation unit.

The method further comprises forming a touch buffer film disposed between the encapsulation unit and the touch electrodes, wherein the touch buffer film is a photoacryl-based, epoxy-based, parylene-C-based, parylene-N-based, parylene-F-based or siloxane-based organic film.

The method further comprises forming a touch insulating film disposed so as to cover the touch electrodes; forming a plurality of second touch electrodes disposed so as to be spaced apart from the touch electrodes.

The method further comprises forming first bridges configured to connect the touch electrodes.

The method further comprises forming second bridges configured to connect the second touch electrodes.

At least one of the touch electrodes, the second touch electrodes, the first bridges and the second bridges is formed of an amorphous transparent conductive layer.

The formation of the at least one of the touch electrodes, the second touch electrodes, the first bridges and the second bridges, formed of the amorphous transparent conductive layer, includes: depositing a transparent conductive layer on the encapsulation unit at room temperature; and patterning the transparent conductive layer.

The formation of the touch insulating film includes: depositing an inorganic film on the substrate provided with the touch electrodes formed thereon; cleaning the substrate provided with the inorganic film deposited thereon; and repeating deposition of the inorganic film and cleaning of the substrate at least two times, wherein the inorganic film is formed of SiNx, SiON or SiO2.

The formation of the touch insulating film includes: coating an organic film on the substrate provided with the touch electrodes formed thereon; and curing the organic film at a low temperature between room temperature and 100° C., wherein the touch insulating film is a photoacryl-based, epoxy-based, parylene-C-based, parylene-N-based, parylene-F-based or siloxane-based organic film.

The formation of the touch electrodes formed of the amorphous transparent conductive layer on the encapsulation unit includes: depositing a transparent conductive layer on the encapsulation unit at room temperature; and patterning the transparent conductive layer, wherein each of the touch electrodes has electrically independent self-capacitance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the present disclosure and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
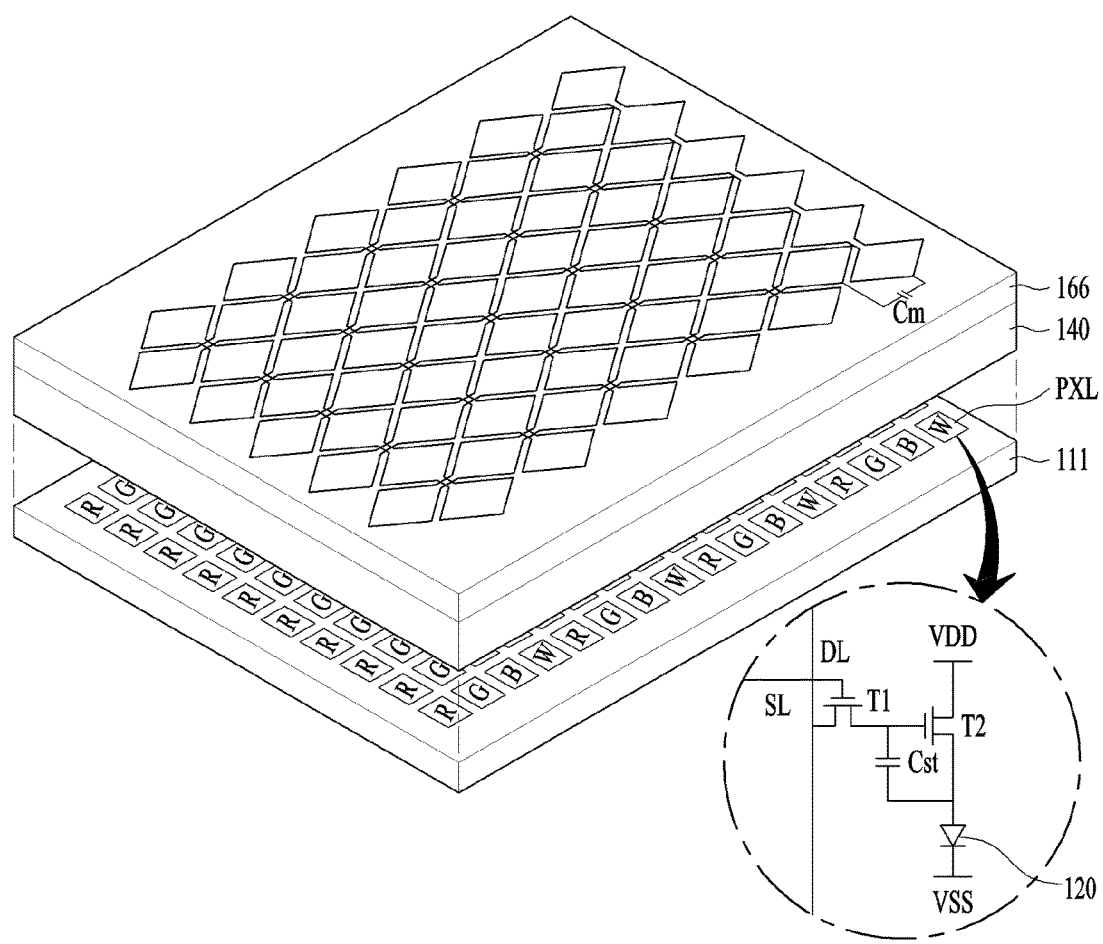
FIG. 1 is a perspective view of an organic light emitting display having touch sensors in accordance with one embodiment of the present disclosure.

FIG. 1 is a perspective view of an organic light emitting display having touch sensors in accordance with one embodiment of the present invention.

Figure 2:
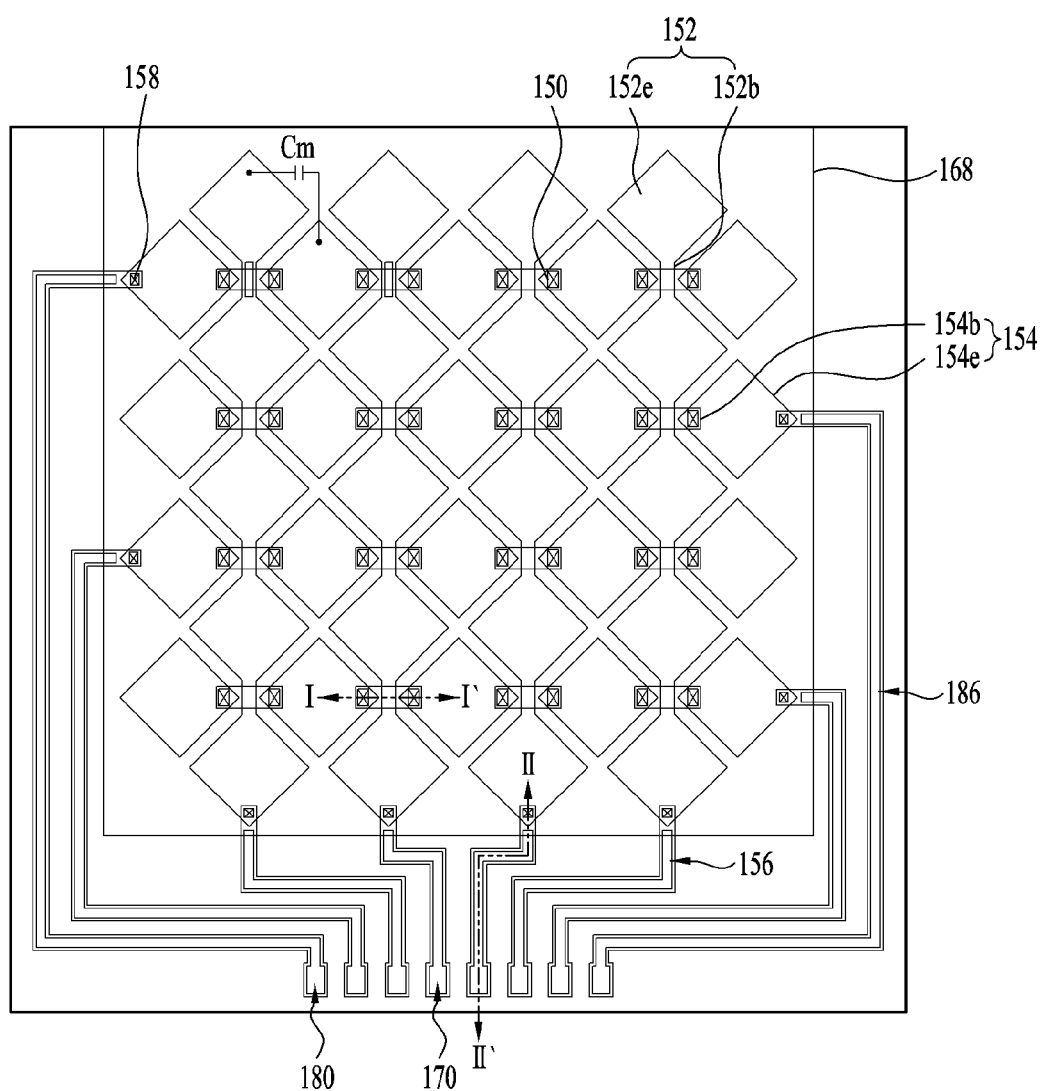
FIG. 2 is a plan view of the organic light emitting display shown in FIG. 1 in accordance with one embodiment.

The organic light emitting display shown in FIG. 1 senses whether or not user touch occurs and a touch position by sensing change in mutual capacitance Cm due to the user touch during a touch period through touch electrodes 152e and 154e shown in FIG. 2. Further, the organic light emitting display shown in FIG. 1 displays an image through unit pixels including light emitting elements 120. The unit pixel includes red (R), green (G) and blue (B) sub-pixels PXL, or includes red (R), green (G), blue (B) and white (W) sub-pixels PXL.

For this purpose, the organic light emitting display shown in FIG. 1 includes a plurality of sub-pixels PXL arranged in a matrix on a substrate 111, an encapsulation unit 140 disposed on the sub-pixels PXL, and mutual capacitances Cm disposed on the touch buffer film 166.

Each of the sub-pixels PXL includes a pixel driving circuit and a light emitting element 120 connected to the pixel driving circuit.

The pixel driving circuit includes a switching transistor T1, a driving transistor T2 and a storage capacitor Cst.

When a scan pulse is supplied to a scan line SL, the switching transistor T1 is turned on and thus supplies a data signal supplied to a data line DL to the storage capacitor Cst and a gate electrode of the driving transistor T2.

The driving transistor T2 controls current I supplied from a high voltage power VDD line to the light emitting element 120 in response to the data signal supplied to the gate electrode of the driving transistor T2, thus adjusting the amount of light emitted from the light emitting element 120. Further, even if the switching transistor T1 is turned off, the driving transistor T2 supplies regular current I by voltage charging the storage capacitor Cst until a data signal of a next frame is supplied and, thus, the light emitting element 120 maintains light emission.

Figure 3:
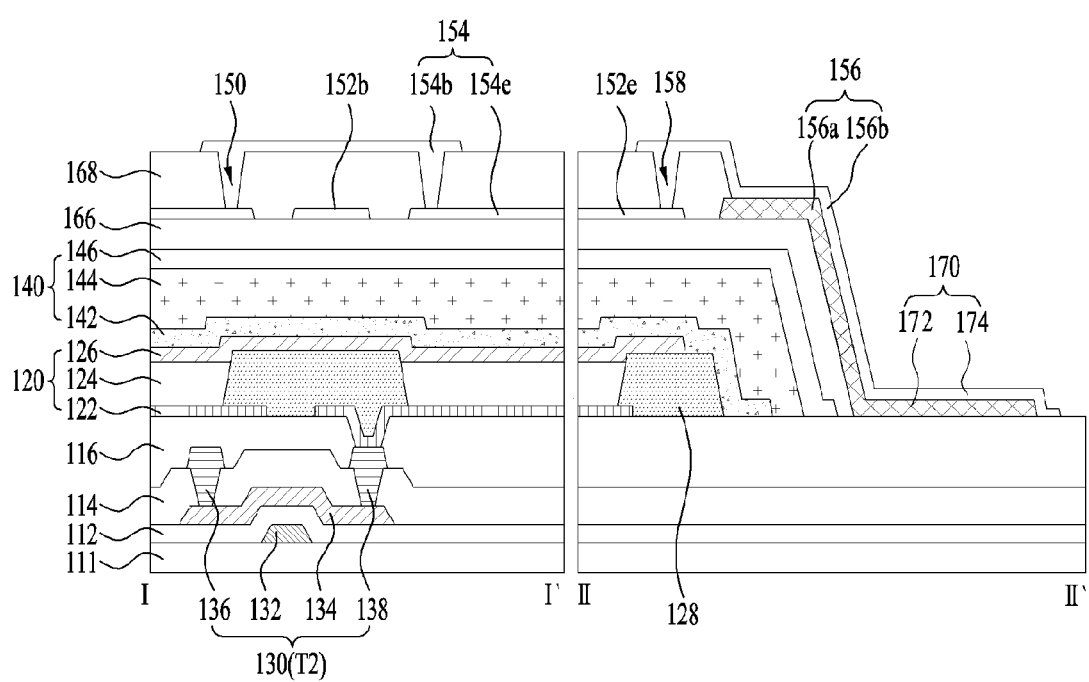
FIG. 3 is a cross-sectional view of the organic light emitting display, taken along line I-I' and line II-II' of FIG. 2 in accordance with one embodiment.

Such a driving thin film transistor 130 (T2) includes, as exemplarily shown in FIG. 3, a gate electrode 132, a semiconductor layer 134 overlapping the gate electrode 132 with a gate insulating film 112 interposed therebetween, and source and drain electrodes 136 and 138 formed on a protective film 114 and contacting the semiconductor layer 134.

The light emitting element 120 includes an anode 122, an organic light emitting layer 124 formed on the anode 122, and a cathode 126 formed on the organic light emitting layer 124.

The anode 122 is conductively connected to the drain electrode 138 of the driving thin film transistor 130 exposed through a pixel contact hole formed through a planarization film 116. The organic light emitting layer 124 is formed on the anode 122 in an emission region provided by a bank 128. The organic light emitting layer 124 is formed by stacking a hole-related layer, a light emitting layer and an electron-related layer on the anode 122 in regular order or in reverse order. The cathode 126 is formed opposite the anode 122 with the organic light emitting layer 124 interposed therebetween.

The encapsulation unit 140 prevents external moisture or oxygen from penetrating through the light emitting element 120, which is vulnerable to external moisture or oxygen. For this purpose, the encapsulation unit 140 includes a plurality of inorganic encapsulation layers 142 and 146 and an organic encapsulation layer 144 disposed between the inorganic encapsulation layers 142 and 146, and the inorganic encapsulation layer 146 is disposed as the uppermost layer. Here, the encapsulation unit 140 includes at least two inorganic encapsulation layers 142 and 146 and at least one organic encapsulation layer 144. In the present disclosure, the structure of the encapsulation unit 140, in which the organic encapsulation layer 144 is disposed between the first and second inorganic encapsulation layers 142 and 146, will be exemplarily described.

The first inorganic encapsulation layer 142 is formed on the substrate 111 provided with the cathode 126 so as to be located most adjacent to the light emitting element 120. Such a first inorganic encapsulation layer 142 is formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Since the first inorganic encapsulation layer 142 is deposited at a low temperature, damage to the organic light emitting layer 124, which is vulnerable to a high-temperature atmosphere, during a deposition process of the first inorganic encapsulation layer 142 may be prevented.

The organic encapsulation layer 144 serves as a buffer to damp stress between respective layers according to bending of the organic light emitting display and strengthens planarization performance of the organic light emitting display. The organic encapsulation layer 144 is formed of an organic insulating material, such as acrylic resin, epoxy resin, polyimide, polyethylene or silicon oxycarbide (SiOC).

The second inorganic encapsulation layer 146 is formed on the substrate 111 provided with the organic encapsulation layer 144 formed thereon so as to cover the upper and side surfaces of the organic encapsulation layer 144 and the first organic encapsulation layer 142. Therefore, the second inorganic encapsulation layer 146 minimizes or blocks penetration of external moisture or oxygen into the first inorganic encapsulation layer 142 and the organic encapsulation layer 144. Such a second inorganic encapsulation layer 146 is formed of an inorganic insulating material, such as silicon nitride ($SiN_x$), silicon oxide ($SiO_x$), silicon oxynitride (SiON) or aluminum oxide ($Al_2O_3$).

The touch buffer film 166 is disposed on the encapsulation unit 140. The touch buffer film 166 is formed between each of touch sensing lines 154 and touch driving lines 152 and the light emitting element 120, has a thickness of 50 nm-5 μm and thus maintains a separation distance of at least 5 μm between each of the touch sensing lines 154 and the touch driving lines 152 and the cathode 126. Therefore, capacitance of a parasitic capacitor formed between each of the touch sensing lines 154 and the touch driving lines 152 and the cathode 126 may be minimized and, thus, mutual influences between each of the touch sensing lines 154 and the touch driving lines 152 and the cathode 126 due to coupling therebetween may be prevented. If the separation distance between each of the touch sensing lines 154 and the touch driving lines 152 and the cathode 126 is less than 5 μm, touch performance is lowered by mutual influences between each of the touch sensing lines 154 and the touch driving lines 152 and the cathode 126 due to coupling therebetween.

Further, the touch buffer film 166 may prevent a liquid chemical (a developing solution or an etching solution), used during a process of manufacturing the touch sensing lines 154 and the touch driving lines 152 disposed on the touch buffer film 166, or moisture from the outside from invading the organic light emitting layer 124. Therefore, the touch buffer film 166 may prevent damage to the organic light emitting layer 124, which is vulnerable to the liquid chemical or moisture.

The touch buffer film 166 may be formed at a low temperature of 100° C. or lower and be formed of an organic insulating material having a low dielectric constant of 1 to 3, so as to prevent damage to the organic light emitting layer 124, which is vulnerable to high temperature. For example, the touch buffer film 166 may be formed of a photoacryl-based, epoxy-based or siloxane-based material. The touch buffer film 166 formed of an organic insulating material and having planarization performance may prevent breakage of the touch sensing lines 154 and the touch driving lines 152 formed on the touch buffer film 166 and damage to the respective encapsulation layers 142, 144 and 146 of the encapsulation unit 140 due to warpage of the organic light emitting display.

The touch sensing lines 154 and the touch driving lines 152 are disposed on the touch buffer film 166 so as to intersect each other with a touch insulating film 168 interposed therebetween.

The touch driving line 152 includes a plurality of first touch electrodes 152e and first bridges 152b to conductively connect the first touch electrodes 152e.

The first touch electrodes 152e are spaced apart from each other in the Y-axis direction on the touch buffer film 166. Each of the first touch electrodes 152e is conductively connected to the adjacent first touch electrode 152e through the first bridge 152b.

The first bridges 152b are formed on the touch buffer film 166 so as to be coplanar with the first touch electrodes 152e, and are conductively connected to the first touch electrodes 152e without separate contact holes.

The touch sensing line 154 includes a plurality of second touch electrodes 154e and second bridges 154b to conductively connect the second touch electrodes 154e.

The second touch electrodes 154e are spaced apart from each other in the X-axis direction on the touch buffer film 166. Each of the second touch electrodes 154e is conductively connected to the adjacent second touch electrode 154e through the second bridge 154b.

The second bridges 154b are disposed on the touch insulating film 168, exposed through touch contact holes 150 formed through the touch insulating film 168, and conductively connected to the second touch electrodes 154e. In the same manner as the first bridge 152b, the second bridge 154b is disposed so as to overlap the bank 128 and, thus, reduction of an aperture ratio due to the first and second bridges 152b and 154b may be prevented.

Since the touch sensing lines 154 and the touch driving lines 152 intersect each other with the touch insulating film 168 interposed therebetween, mutual capacitances Cm are formed at the intersections between the touch sensing lines 154 and the touch driving lines 152. Therefore, the mutual capacitance Cm is charged with charges by a touch driving pulse supplied from the touch driving line 152 and discharges the charges to the touch sensing line 154, thus serving as a touch sensor.

The touch driving lines 152 of the present disclosure are connected to a touch driving unit (not shown) through first routing lines 156 and touch driving pads 170. Further, the touch sensing lines 154 are connected to the touch driving unit through second routing lines 186 and touch sensing pads 180.

Each of the first and second routing lines 156 and 186 comprises an upper portion, a side portion and a lower portion. The upper portion of the routing lines 156 and 186 is partly overlapping the encapsulation unit 140. The upper portion of the routing lines 156 and 186 is provided on a higher level than the encapsulation unit 140. The side portion of the routing lines 156 and 186 cover the side surface of the encapsulation unit 140 or the touch buffer layer 166. The lower portion of the routing lines 156 and 186 is provided on the planarization film 116 and on the same layer as the anode 122 of the light emitting element 120.

Each of the first routing lines 156 includes a first routing layer 156a and a second routing layer 156b stacked on the first routing layer 156a, and each of the second routing lines 186 includes a first routing layer (not shown) and a second routing layer (not shown). The first routing layer 156a may be formed to have a monolayer structure or a multilayer structure using a first conductive layer, i.e., an inorganic conductive material having high corrosion resistance and high acid resistance, such as aluminum Al, titanium Ti, copper Cu and molybdenum Mo. For example, the first conductive layer has a tri-layer structure, such as Ti/Al/Ti or Mo/Al/Mo. Further, the second routing layer 156b is a third conductive layer, i.e., a transparent conductive layer, having high corrosion resistance and high acid resistance, formed of indium tin oxide ITO or indium zinc oxide IZO. The second routing layer 156b is made of the same material as at least one of the touch electrodes 152e, 154e.

A portion of the first routing layer 156a overlaps an upper side of the touch buffer layer 166. Thus, at least a part of the first routing layer 156a of the routing lines 156, 186 is provided on a higher level than the encapsulation unit 140. The portion of the first routing layer 156a is provided on same layer as at least one of the touch electrodes 152e, 154e. The first routing layer 156a is provided on an upper side of the touch buffer layer 166 in a non display area. The first routing layer 156a is thicker than second routing layer 156b. The first routing layer 156a is thicker than at least one of the touch electrodes 152e, 154e. The portion of the first routing layer 156a overlaps the touch insulating film 168. Thus, the touch insulating film 168 is electrically separating the first routing layer 156a from at least one of the touch electrodes 152e, 154e. The second routing layer 156b is fully covering the first routing layer 156a in a portion of the touch pad 170. The second routing layer 156b is contacting the insulating layer at the outermost portion.

The first routing layer 156a of the first routing line 156 is conductively connected to the first touch electrode 152e via second routing layer 156b of the first routing line 156 by a routing contact hole 158. Thus, the first routing line 156 transmits a touch driving pulse from the touch driving pad 170 to the touch driving line 152. The first routing layer 156a of the second routing line 186 is conductively connected to the second touch electrode 154e via second routing layer 156b of the second routing line 186 by the routing contact hole 158. Thus, the second routing line 186 transmits a touch signal from the touch sensing line 154 to the touch sensing pad 180.

Each of the touch driving pads 170 is connected to the first touch electrode 152e through the first routing lines 156. Each of the touch sensing pads 180 is connected to the second touch electrode 154e through the second routing lines 186. Each of the touch driving pads 170 includes a pad electrode 172 and a pad cover electrode 174 disposed on the pad electrode 172 so as to cover the pad electrode 172. Further, each of the touch sensing pads 180 includes a pad electrode (not shown) and a pad cover electrode (not shown) disposed on the pad electrode so as to cover the pad electrode.

The pad electrode 172 extends from the first routing layer 156a of the first routing line 156. Therefore, the pad electrode 172 is formed of the first conductive layer in the same manner as the first routing layer 156a. The pad electrode 172 is in contact with the insulating layer (e.g. the gate insulating film 112, the protective film 114, or planarization film 116) between the substrate 111 and the encapsulation unit 140. The pad cover electrode 174 extends from the second routing layer 156b. Therefore, the pad cover electrode 174 is formed of the third conductive layer in the same manner as the second routing layer 156b. The pad cover electrode 174 is exposed by a touch protective film, thus being connected to a signal transmission film on which the touch driving unit is mounted. Here, the touch protective film is formed to cover the touch sensing lines 154 and the touch driving lines 152, thus preventing the touch sensing lines 154 and the touch driving lines 152 from being corroded by external moisture, etc. The touch protective film is a film formed of an organic insulating material, a circularly polarizing plate, or a film formed of epoxy or acryl. The structures of the pad electrode 172 and the pad cover electrode 174 of the touch driving pads 170 may be applied to the pad electrode and the pad cover electrode of the touch sensing pad 180.

In the organic light emitting display having touch sensors in accordance with the present disclosure, after the organic light emitting layer 124 is formed, a process of fabricating the organic light emitting display is carried out at a low temperature (about 100° C. or lower) so as to protect the organic light emitting layer 124, which is vulnerable to high temperature. Therefore, the fabrication process is varied according to materials of conductive thin film layers and insulating thin film layers disposed on the organic light emitting layer 124.

In more detail, if at least one insulating thin film layer out of the organic encapsulation layer 144 of the encapsulation unit 140, the touch insulating film 168 and the touch buffer film 166 disposed on the organic light emitting layer 124 is formed of a photoacryl-based, epoxy-based, parylene-C-based, parylene-N-based, parylene-F-based or siloxane-based organic film, the insulating thin film layer is coated on the substrate 111 and is then cured at a temperature of 100° C. or lower.

Figure 4:
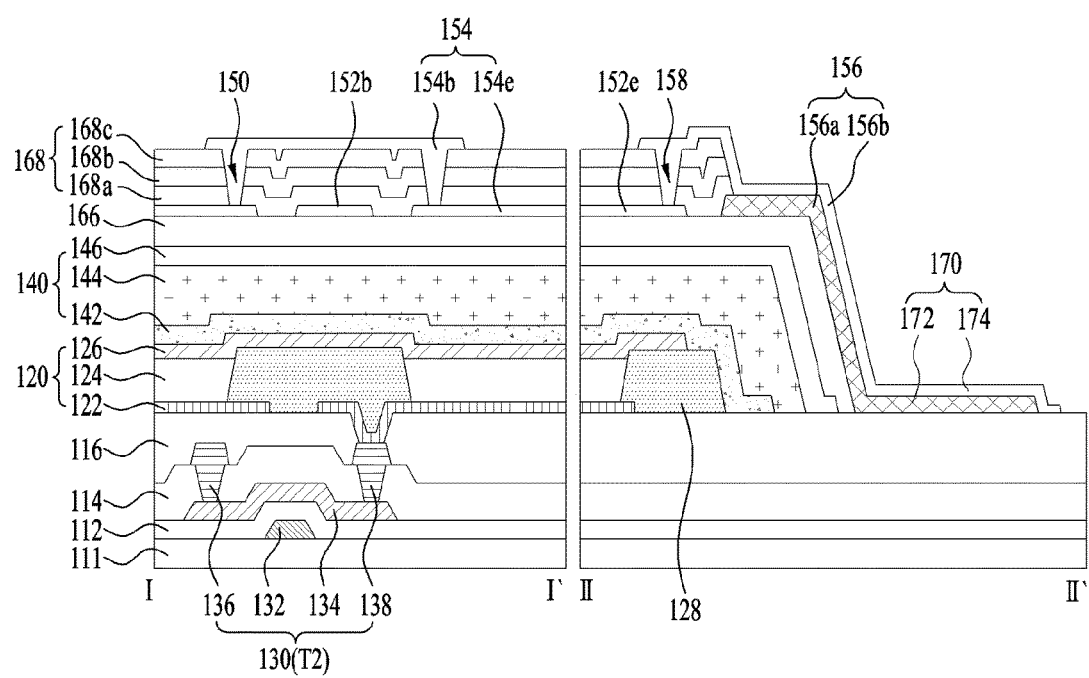
FIG. 4 is a cross-sectional view of a touch insulating film in accordance with another embodiment, shown in FIG. 3.

Further, if at least one insulating thin film layer out of the inorganic encapsulation layers 142 and 146 of the encapsulation unit 140, the touch insulating film 168 and the touch buffer film 166 disposed on the organic light emitting layer 124 is formed of an inorganic film, such as silicon nitride $SiN_x$, silicon oxynitride SiON or silicon oxide $SiO_2$, deposition of the insulating film on the substrate 111 at a low temperature and cleaning are repeated at least two times, thereby forming a multilayer structure. For example, the touch insulating film 168 has a tri-layer structure including first to third touch insulating film layers 168a, 168b and 168c, as exemplarily shown in FIG. 4. Here, if the insulating thin film layer formed of an inorganic film is formed through a low-temperature deposition process, particles of the insulating thin film layer are formed by non-reacted substances generated due to low activation energy during the deposition process. When the particles are removed by cleaning, pores are formed at positions of the insulating thin film layer, from which the particles are removed. In order to prevent moisture from penetrating through the pores, the insulating thin film layer is formed to have a multilayer structure and thus the pores of the insulating thin film layer are shielded by another insulating thin film layer located thereon. If at least one insulating thin film layer out of the encapsulation unit 140, the touch insulating film 168 and the touch buffer film 166 is formed to have a multilayer structure, respective layers of the multilayer structure may be formed of the same material or at least one layer may be formed of a different material from other layers.

If at least one conductive thin film layer out of the first and second touch electrodes 152e and 154e, the first and second bridges 152b and 154b, the first and second routing lines 156 and 186, the touch sensing pads 180 and the touch driving pads 170 disposed on the organic light emitting layer 124 is formed of a metal, the conductive thin film layer is formed through a deposition process at room temperature. Further, if at least one conductive thin film layer out of the first and second touch electrodes 152e and 154e, the first and second bridges 152b and 154b, the first and second routing lines 156 and 186, the touch sensing pads 180 and the touch driving pads 170 disposed on the organic light emitting layer 124 is formed of a conductive polymer, the conductive thin film layer is coated on the substrate 111 and is then cured at a temperature of 100° C. or lower.

Further, if at least one conductive thin film layer out of the first and second touch electrodes 152e and 154e, the first and second bridges 152b and 154b, the first and second routing lines 156 and 186, the touch sensing pads 180 and the touch driving pads 170 disposed on the organic light emitting layer 124 is a transparent conductive layer, the conductive thin film layer is deposited at room temperature through deposition, such as sputtering, etc., without heat treatment at a temperature of 100° C. or higher. Therefore, the conductive thin film layer formed through the low-temperature process has amorphous characteristics and prevents damage to the organic light emitting layer 124 disposed below the conductive thin film layer.

Further, even if the touch driving lines 152 and the touch sensing lines 154 are formed through a low-temperature process, a transparent conductive layer forming the touch driving lines 152 and the touch sensing lines 154 may be amorphous or crystalline according to the material of a lower film disposed below the transparent conductive layer. That is, the transparent conductive layer is amorphous on an organic film rather than an inorganic film. Since an organic film contains a larger amount of hydrogen radicals, which hinder formation of seeds for crystalline growth, than an inorganic film, a transparent conductive layer formed on the organic film has low crystallinity and is thus grown to be amorphous. On the other hand, since an inorganic film contains a relatively small amount of hydrogen radicals, which hinder formation of seeds for crystalline growth, a transparent conductive layer formed on the inorganic film has high crystallinity and is thus grown to be crystalline.

Therefore, if the touch buffer film 166 and the touch insulating film 168 disposed below the touch driving lines 152 and the touch sensing lines 154 are organic films, the touch driving lines 152 and the touch sensing lines 154 formed through the low-temperature process are grown to be amorphous. Further, if the touch buffer film 166 and the touch insulating film 168 disposed below the touch driving lines 152 and the touch sensing lines 154 are inorganic films, the touch driving lines 152 and the touch sensing lines 154 formed through the low-temperature process are grown to be crystalline. Further, if any one of the touch buffer film 166 and the touch insulating film 168 is an organic (inorganic) film, at least one of the first and second touch electrodes 152e and 154e and the first and second bridges 152b and 154b of the touch driving lines 152 and the touch sensing lines 154 disposed on the organic film are formed of an amorphous (crystalline) transparent conductive film formed through the low-temperature process.

As such, at least one of the touch driving lines 152 including the first touch electrodes 152e and the first bridges 152b and the touch sensing lines 154 including the second touch electrodes 154e and the second bridges 154b is formed of an amorphous (or crystalline) transparent conductive layer. Each of the touch driving lines 152 and the touch sensing lines 154 formed of an amorphous (or crystalline) transparent conductive layer having a thickness of 10 nm-100 nm (100 Å-1000 Å) has low resistance of about 40 Ω/sq to 150 Ω/sq and may thus maintain fast response speed. Further, each of the touch driving lines 152 and the touch sensing lines 154 formed of an amorphous (or crystalline) transparent conductive layer having a thickness of 10 nm-100 nm (100 Å-1000 Å) has high transmittance of about 80% to 90%.

As described above, in the organic light emitting display in accordance with the present disclosure, the respective thin film layers (for example, the touch electrodes, the touch buffer film, the touch insulating film, etc.) disposed above the organic light emitting layer 124 are formed through low-temperature processes and, thus, damage to the organic light emitting layer 124, which is vulnerable to high temperature, may be prevented. Further, while, in a conventional organic light emitting display, a touchscreen is attached to a display panel through an adhesive, in the organic light emitting display in accordance with the present invention, the touch electrodes 152e and 154e are disposed on the encapsulation unit 140, a separate attachment process is omitted and, thus, process simplification and cost reduction may be achieved.

FIGS. 5A to 5D are plan and cross-sectional views illustrating a method of fabricating the organic light emitting display shown in FIG. 3.

Figure 5A:
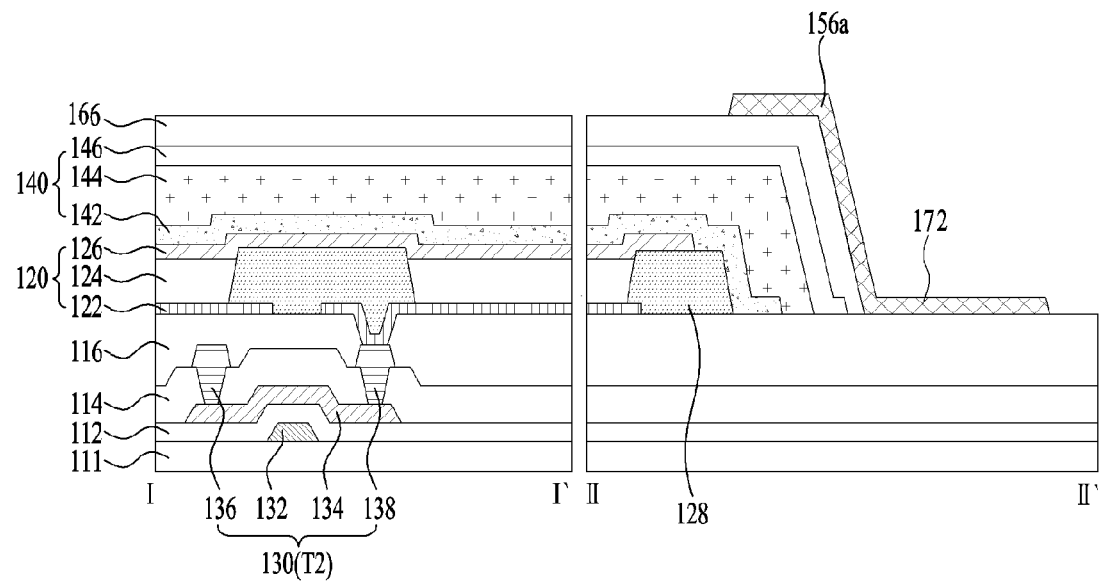
FIGS. 5A to 5D are cross-sectional views illustrating a method of fabricating the organic light emitting display shown in FIG. 3 in accordance with one embodiment.

With reference to FIG. 5A, the touch buffer film 166, the first routing layers 156a of the first routing lines 156, the first routing layers (not shown) of the second routing lines 186, the pad electrodes 172 of the touch driving pads 170 and the pad electrodes (not shown) of the touch sensing pads 180 are formed on the substrate 111 provided with the switching transistors, the driving transistors 130, the anodes 122, the organic light emitting layer 124, the cathodes 126 and the encapsulation unit 140 formed thereon.

In more detail, the touch buffer layer 166 is formed by coating an organic insulating material on the substrate 111 provided with the switching transistors, the driving transistors 130, the anodes 122, the organic light emitting layer 124, the cathodes 126 and the encapsulation unit 140 formed thereon using a metal mask, and then curing the organic insulating material at a curing temperature of 100° C. or lower. Thereafter, a first conductive layer is deposited on the entire surface of the touch buffer film 166 at room temperature through a deposition process using sputtering and is then patterned through a photolithography process and an etching process, thereby forming the first routing layers 156a and the pad electrodes 172. Here, the first conductive layer is formed to have a monolayer structure or a multilayer structure using metals having high corrosion resistance and high acid resistance, such as Al, Ti, Cu and Mo. For example, the first conductive layer has a tri-layer structure, such as Ti/Al/Ti or Mo/Al/Mo.

Figure 5B:
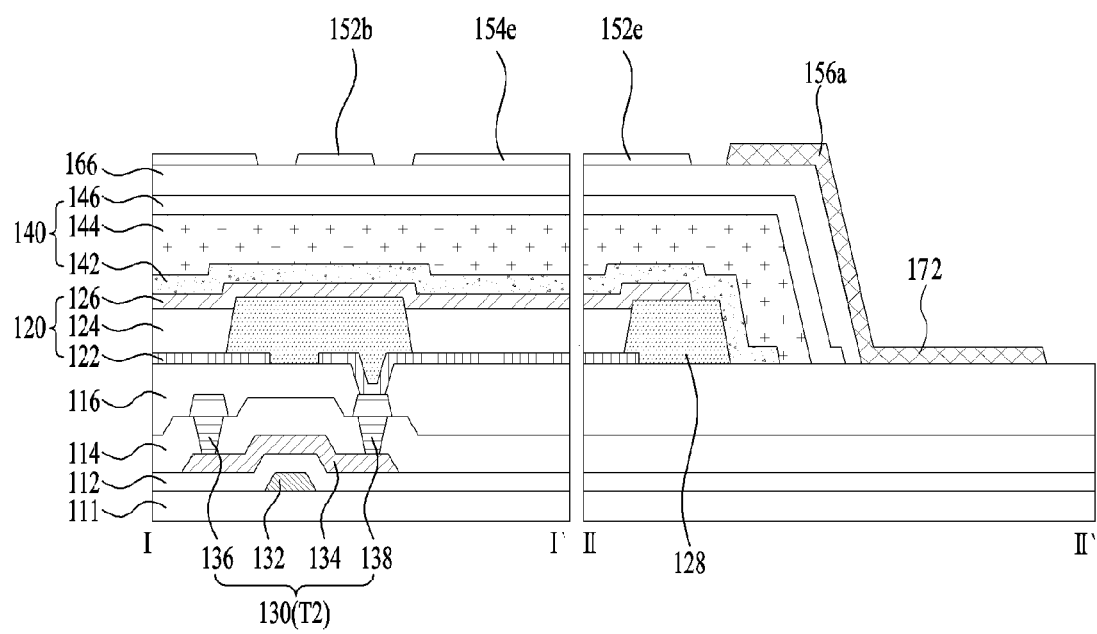

Thereafter, with reference to FIG. 5B, the first and second touch electrodes 152e and 154e and the first bridges 152b are formed on the substrate 111 provided with the first routing layers 156a and the pad electrodes 172.

In more detail, a second conductive layer is deposited on the entire surface of the substrate 111 provided with the first routing layers 156a and the pad electrodes 172. Here, if a transparent conductive layer, such as ITO or IZO, is used as the second conductive layer, the transparent conductive layer is formed at room temperature through a deposition method, such as sputtering. If a conductive polymer is used as the second conductive layer, the conductive polymer is coated on the substrate 111 and is then cured at a temperature of 100° C. or lower. Thereafter, the second conductive layer is patterned through a photolithography process and an etching process, thereby forming the first and second touch electrodes 152e and 154e and the first bridges 152b.

Figure 5C:
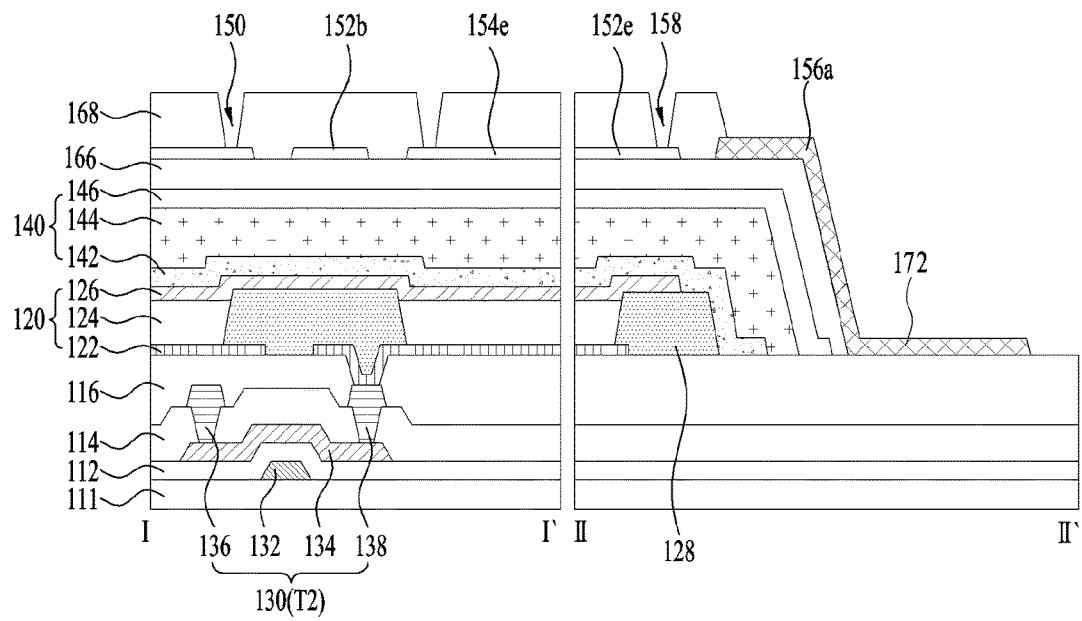

With reference to FIG. 5C, the touch insulating film 168 having the touch contact holes 150 and the routing contact holes 158 is formed on the substrate 111 provided with the first and second touch electrodes 152e and 154e and the first bridges 152b.

In more detail, the touch insulating film 168 having a thickness of 50 nm (500 Å)-5 μm is formed on the substrate 111 provided with the first and second touch electrodes 152e and 154e and the first bridges 152b through deposition or coating. If an organic film is used as the touch insulating film 168, the organic film is coated on the substrate 111 and is then cured at a temperature of 100° C. or lower, thereby forming the touch insulating film 168. If an inorganic film is used as the touch insulating film 168, a low-temperature CVD process and a cleaning process are repeated at least two times, thereby forming the touch insulating film 168 having a multilayer structure. Thereafter, the touch insulating film 168 is patterned through a photolithography process and an etching process, thereby forming the touch contact holes 150 and the routing contact holes 158.

Figure 5D:
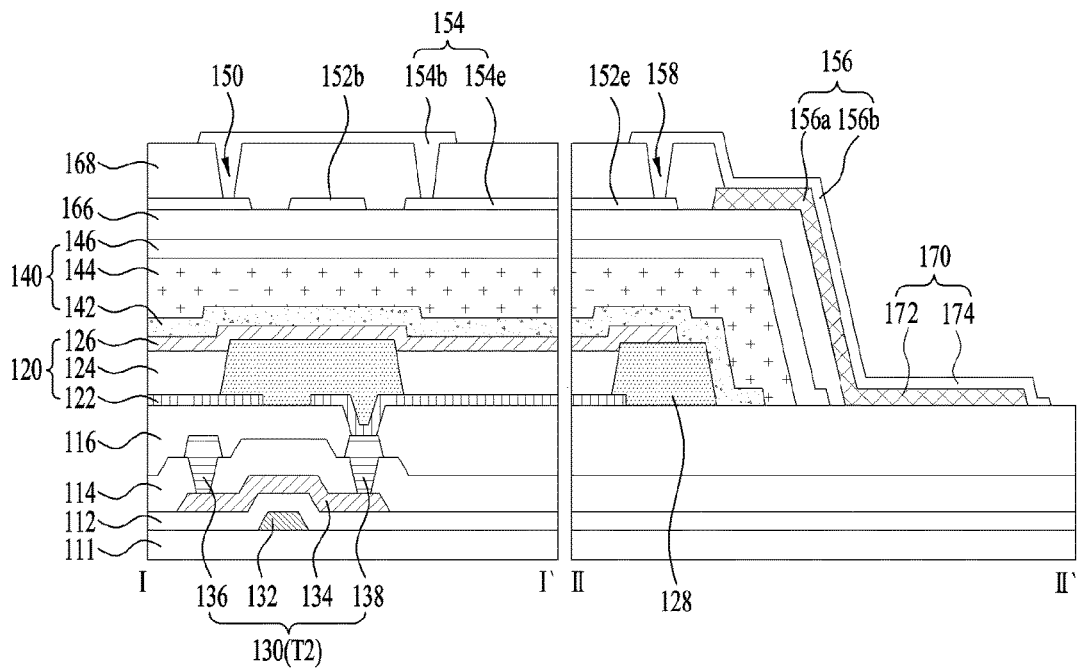

With reference to FIG. 5D, the second bridges 154b, the second routing layers 156b of the first routing lines 156, the second routing layers (not shown) of the second routing lines 186, the pad cover electrodes 174 of the touch driving pads 170 and the pad cover electrodes (not shown) of the touch sensing pads 180 are formed on the substrate 111 provided with the touch insulating film 168 having the touch contact holes 150 and the routing contact holes 158.

In more detail, a third conductive layer is formed on the substrate 111 provided with the touch insulating film 168 having the touch contact holes 150 and the routing contact holes 158. Here, if a transparent conductive layer, such as ITO or IZO, or a metal having high corrosion resistance and acid resistance, such as Al, Ti, Cu or Mo, is used as the third conductive layer, the third conductive layer is formed at room temperature through a deposition method, such as sputtering. Further, if a conductive polymer is used as the third conductive layer, the conductive polymer is coated on the substrate 111 and is then cured at a temperature of 100° C. or lower. Thereafter, the third conductive layer is patterned through a photolithography process and an etching process, thereby forming the second bridges 154b, the second routing layers 156b and the pad cover electrodes 174.

Figure 6:
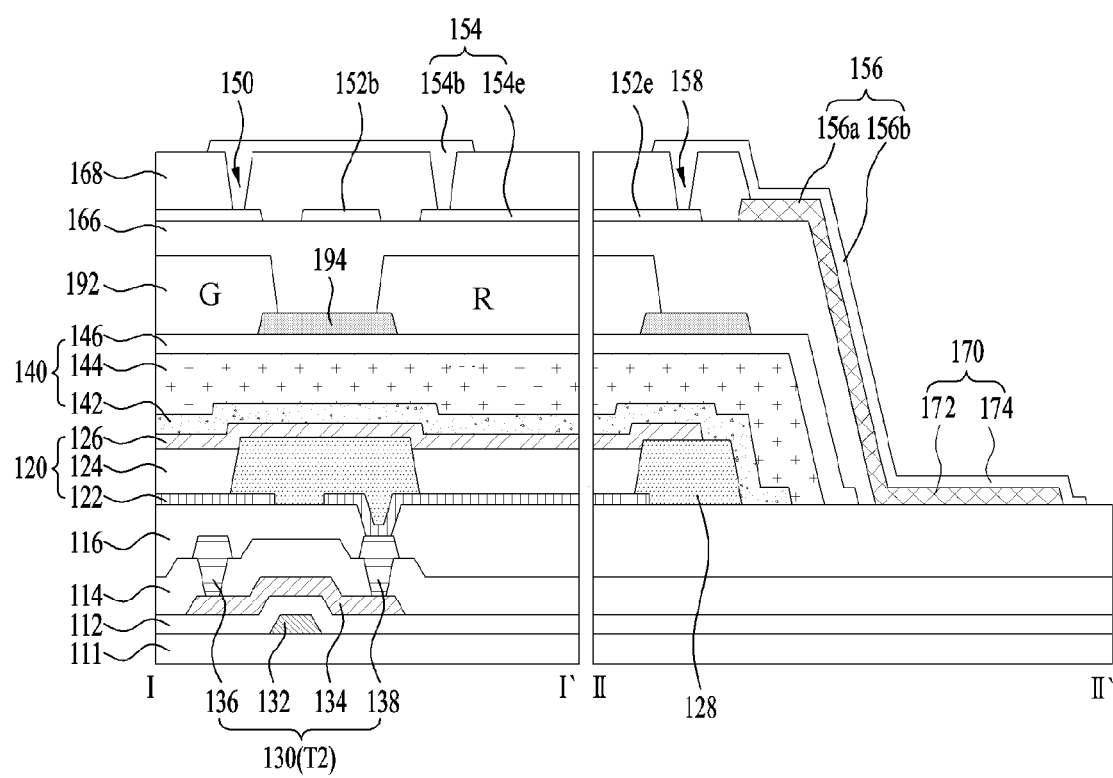
FIG. 6 is a cross-sectional view of an organic light emitting display having touch sensors, which includes color filters, in accordance with another embodiment of the present disclosure.

FIG. 6 is a cross-sectional view of an organic light emitting display having touch sensors in accordance with another embodiment of the present disclosure.

The organic light emitting display shown in FIG. 6 is the same as the organic light emitting display shown in FIG. 3, except that the organic light emitting display shown in FIG. 6 further includes color filters 192 disposed on an encapsulation unit 140 or a touch buffer film 166. Therefore, a detailed description of elements of the organic light emitting display shown in FIG. 6, which are substantially the same as those of the organic light emitting display shown in FIG. 3, will be omitted because it is considered to be unnecessary.

The color filters 192 together with the touch buffer film 166 are formed between each of touch sensing lines 154 and touch driving lines 152 and a light emitting element 120. A separation distance between each of the touch sensing lines 154 and the touch driving lines 152 and the light emitting element 120 is increased by the color filters 192 and the touch buffer film 166. Therefore, capacitance of a parasitic capacitor formed between each of the touch sensing lines 154 and the touch driving lines 152 and the light emitting element 120 may be minimized and, thus, mutual influences between each of the touch sensing lines 154 and the touch driving lines 152 and the light emitting element 120 due to coupling therebetween may be prevented. Further, the touch buffer film 166 and the color filters 192 may prevent a liquid chemical (a developing solution or an etching solution), used during a process of manufacturing the touch sensing lines 154 and the touch driving lines 152 disposed on the touch buffer film 166, or moisture from the outside from invading an organic light emitting layer 124. Therefore, the touch buffer film 166 and the color filters 192 may prevent damage to the organic light emitting layer 124, which is vulnerable to the liquid chemical or moisture.

A black matrix 194 is disposed between the color filters 192. The black matrix 194 serves to discriminate the respective sub-pixel regions and to prevent optical coherence and light leakage between the adjacent sub-pixel regions. The black matrix 194 is formed of a high-resistance black insulating material or is formed by stacking at least two of red (R), green (G) and blue (B) color filters 192.

As described above, in the organic light emitting display in accordance with the present disclosure, the respective thin film layers (for example, the touch electrodes, the touch buffer film, the touch insulating film, etc.) disposed above the organic light emitting layer 124 are formed through low-temperature processes and, thus, damage to the organic light emitting layer 124, which is vulnerable to high temperature, may be prevented. Further, while, in a conventional organic light emitting display, a touchscreen is attached to a display panel through an adhesive, in the organic light emitting display in accordance with the present disclosure, the touch electrodes 152e and 154e are disposed on the encapsulation unit 140, a separate attachment process is omitted and, thus, process simplification and cost reduction may be achieved.

Figure 7:
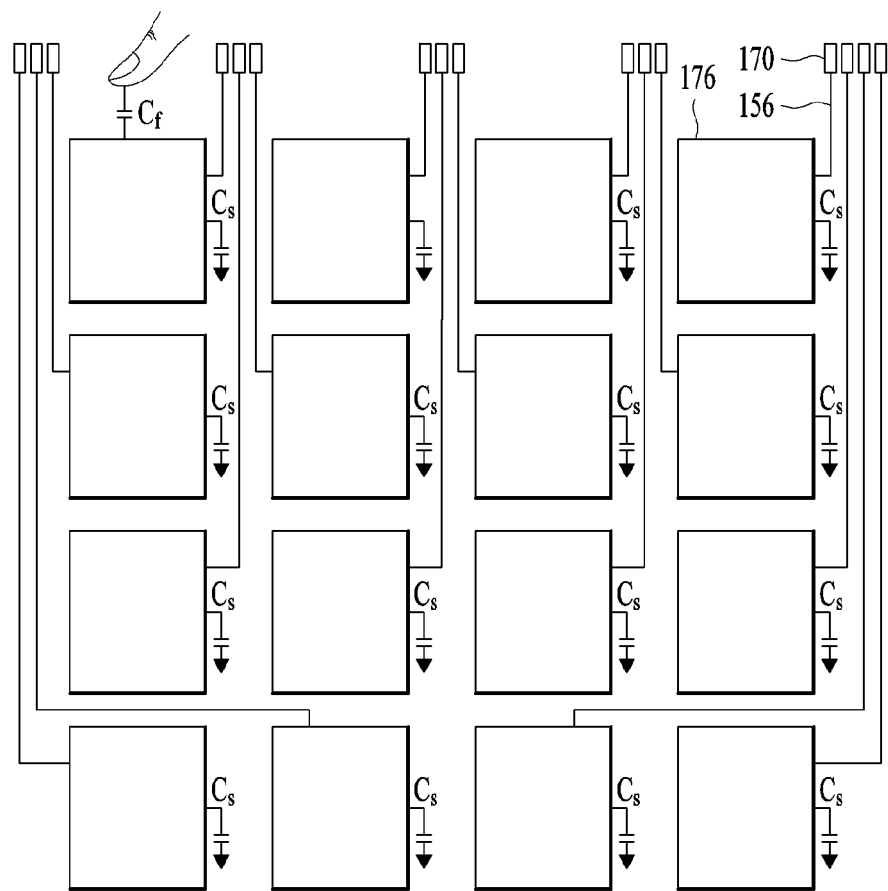
FIG. 7 is a plan view of an organic light emitting display having self-capacitive touch sensors Cs in accordance with the present disclosure.

Further, although the present disclosure exemplarily illustrates that the bridges 154b and the second touch electrodes 154e of the touch sensing lines 154 are disposed on different planes and then are connected through the touch contact holes 150, the bridges 152b and the first touch electrodes 152e of the touch driving lines 152 may be disposed on different planes and then connected through touch contact holes 150. Further, although the present disclosure exemplarily illustrates that the mutual capacitive touch sensors are formed between the touch sensing lines 154 and the touch driving lines 152 intersecting each other, the present disclosure may be applied to self-capacitive touch sensors Cs shown in FIG. 7. Each of a plurality of touch electrodes 176 shown in FIG. 7 has electrically independent self-capacitance and is thus used as a self-capacitive touch sensor Cs which senses change in capacitance by user touch. In a method of sensing self-capacitance using such a touch electrode 176, when a driving signal supplied through a touch pad 170 is applied to the touch electrode 176 through a routing line 156, charges Q are accumulated in the touch sensor Cs. Then, when a user finger or a conductive object contacts the touch electrode 176, parasitic capacitance Cf is additionally connected to the self-capacitive sensor Cs and thus a capacitance value is changed. Therefore, the capacitance value of the touch sensor Cs which the finger touches becomes different from the capacitance value of the touch sensors Cs which the finger does not touch and, thus, whether or not user touch occurs may be judged. In the same manner as the mutual capacitive touch electrodes 152e and 154e shown in FIG. 3, the touch electrodes 176 shown in FIG. 7 are disposed on an encapsulation unit 140 or a touch buffer film 166 disposed to cover light emitting elements 120. In this case, the touch electrodes 176 shown in FIG. 7 and the routing lines 156 connected to the touch electrodes 176 are formed through a deposition process at a low temperature (a temperature between room temperature and 100° C.) and thus have amorphous characteristics, thereby being capable of preventing damage to the organic light emitting layer 124 when the touch electrodes 176 are formed.

Figure 8:
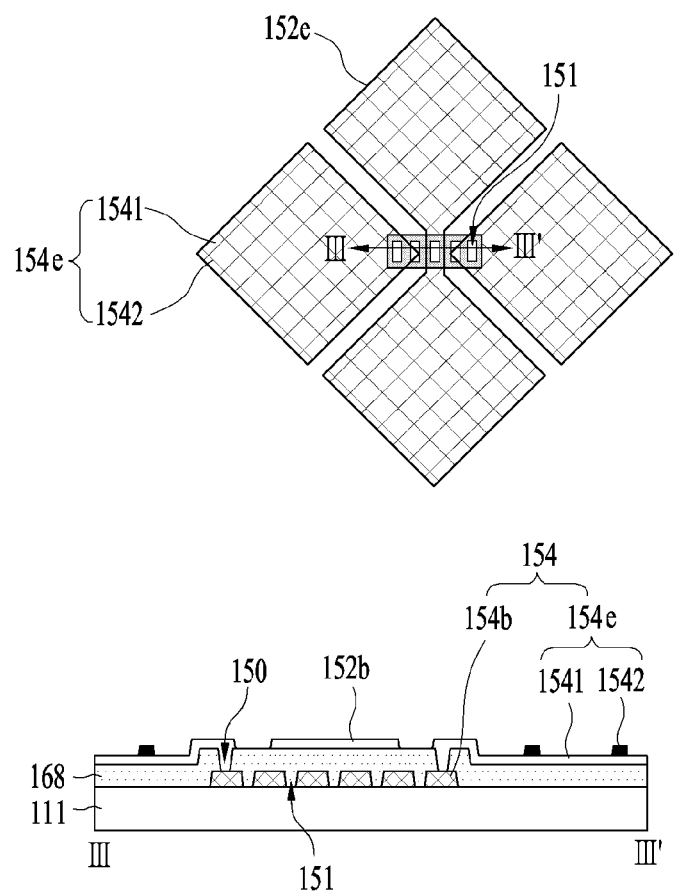
FIG. 8 shows plan and cross-sectional views illustrating touch electrodes and bridges in accordance with another embodiment of the present disclosure.

Moreover, although the present disclosure exemplarily describes that the first and second touch electrodes 152e and 154a of the organic light emitting display are formed of a plate-type transparent conductive film, i.e., the second conductive layer, the first and second touch electrodes 152e and 154a may be formed as a mesh, as exemplarily shown in FIG. 8. That is, the first and second touch electrodes 152e and 154e may include a transparent conductive film 1541 and a mesh metal film 1542 formed as a mesh on the upper or lower surface of the transparent conductive layer 1541. Otherwise, the touch electrodes 152e and 154e may include a mesh metal film 1542 without a transparent conductive layer 1541, or the transparent conductive layer 1541 may be formed as a mesh without a mesh metal film 1542. Here, the mesh metal film 1542 has higher conductivity than the transparent conductive layer 1541 and may thus form low-resistance electrodes as the touch electrodes 152e and 154e. Thereby, resistances and capacitances of the touch electrodes 152e and 154e are reduced and a time constant RC is reduced, thus improving touch sensitivity. Further, the mesh metal film 1542 has a very thin line width and may thus prevent an aperture ratio and transmittance from being lowered due to the mesh metal film 1542. Further, the bridges 154b disposed on a plane differing from the touch electrodes 152e and 154e may be provided with a plurality of slits, as exemplarily shown in FIG. 8. Therefore, the bridges 154b provided with the slits 151 may have a smaller area than bridges provided with no slits. Thereby, reflection of external light by the bridges 154b may be reduced and lowering of visibility may be prevented. Such bridges 154b provided with the slits 151 are formed of a transparent conductive film or an opaque conductive film. If the bridges 154b are formed of an opaque conductive film, the bridges 154b overlap banks 128 and thus prevent lowering of an aperture ratio.

As apparent from the above description, in an organic light emitting display having touch sensors in accordance with the present invention, respective thin film layers disposed above an organic light emitting layer are formed through low-temperature processes and, thus, damage to the organic light emitting layer, which is vulnerable to high temperature, may be prevented. Further, while, in a conventional organic light emitting display, a touchscreen is attached to a display panel through an adhesive, in the organic light emitting display in accordance with the present invention, touch electrodes are disposed directly on an encapsulation unit without an adhesive and thus a separate attachment process is omitted, thereby simplifying the overall process and reducing manufacturing costs.

What is claimed is:

1. An organic light emitting display comprising:
   light emitting elements disposed on a substrate;
   an encapsulation unit disposed on the light emitting elements and including at least one inorganic encapsulation layer and at least one organic encapsulation layer, the encapsulation unit comprising a first surface and a second surface extending downwards from the first surface, the second surface below the first surface;
   a plurality of touch electrodes disposed on the encapsulation unit, wherein at least one of the touch electrodes is formed of an amorphous transparent conductive layer; and
   routing lines for connecting the plurality of touch electrodes to a touch pad and disposed on the encapsulation unit, the routing lines overlapping the second surface of the encapsulation unit.

2. The organic light emitting display according to claim 1, further comprising a touch buffer film disposed between the encapsulation unit and the touch electrodes.

3. The organic light emitting display according to claim 1, wherein the routing lines comprise a first routing layer and a second routing layer, wherein the first routing layer of the routing lines is made of an inorganic conductive material and the second routing layer of the routing lines is made of transparent conductive layer.

4. The organic light emitting display according to claim 3, wherein the second routing layer of the routing lines is made of a same material as at least one of the touch electrodes.

5. The organic light emitting display according to claim 3, wherein a portion of the first routing layer of the routing lines overlaps an upper side of a touch buffer film or a portion of the first routing layer is provided on a same layer as at least one of the touch electrodes or the first routing layer of the routing lines is provided on an upper side of the touch buffer film in a non display area, wherein the touch buffer film is disposed between the encapsulation unit and the touch electrodes.

6. The organic light emitting display according to claim 3, wherein the first routing layer of the routing lines is thicker than second routing layer of the routing lines or the first routing layer is thicker than at least one of the touch electrodes.

7. The organic light emitting display according to claim 3, further comprising a touch insulating film on a portion of or at least partly overlapping the first routing layer of the routing lines.

8. The organic light emitting display according to claim 7, wherein the touch insulating film is electrically separating the first routing layer of the routing lines from at least one of the touch electrodes.

9. The organic light emitting display according to claim 3, wherein one of the touch electrodes is electrically connected to the first routing layer of the routing line via the second routing layer of the routing line by a routing contact hole.

10. The organic light emitting display according to claim 1, further comprising an insulation layer, wherein at least a portion of the routing lines is disposed on the insulation layer.

11. The organic light emitting display according to claim 10, wherein the routing line comprising an upper portion, a side portion and a lower portion.

12. The organic light emitting display according to claim 11, wherein a lower electrode of an organic light emitting diode is provided on the insulation layer and on a same layer as the lower portion of the routing line.

13. The organic light emitting display according to claim 3, wherein the second routing layer of the routing lines is fully covering the first routing layer of the routing line in a portion of the touch pad or the second routing layer of the routing line is contacting an insulating layer at an outermost portion.

14. The organic light emitting display according to claim 11, wherein the upper portion of the routing lines is partly overlapping the encapsulation unit or the upper portion of the routing lines is provided on a higher level than the encapsulation unit.

15. The organic light emitting display according to claim 3, wherein at least a part of the first routing layer of the routing lines is provided on a higher level than the encapsulation unit.

16. The organic light emitting display according to claim 1, wherein the plurality of touch electrodes comprising:
   first touch electrodes, and
   second touch electrodes, the first and second touch electrodes are spaced apart from each other;

first bridges configured to connect the first touch electrodes; and second bridges configured to connect the second touch electrodes, wherein at least one of the first touch electrodes, the second touch electrodes, the first bridges and the second bridges is formed of an amorphous transparent conductive layer.

17. The organic light emitting display according to claim 16, wherein at least one of the first and second touch electrodes comprises:

a mesh metal layer having a mesh shaped pattern; and a transparent conductive layer located on or under the mesh metal layer.

18. The organic light emitting display according to claim 16, wherein at least one of the first and second bridges comprises a slit, the slit of the at least one of the first and second bridges overlaps with the other one of the first and second bridges.

19. The organic light emitting display according to claim 1, further comprising a color filter between the encapsulation unit and the touch electrodes.

20. The organic light emitting display according to claim 16, wherein at least one of the first and second bridges is located corresponding to a bank for defining pixel areas.

21. The organic light emitting display according to claim 11, wherein the routing lines comprise a first portion on the upper surface of the encapsulation unit, a second portion extending form the first portion and on the side surface of the encapsulation unit.

22. The organic light emitting display according to claim 21, wherein the routing lines further comprise a third portion extending from the second portion and in contact with the insulation layer.

23. The organic light emitting display according to claim 1, wherein the second surface is below the first surface in a cross-section view of the organic light emitting display.

24. The organic light emitting display according to claim 1, wherein the second surface is closer to a top-most surface of the substrate than the first surface.

* * * * *